United States Patent
Junker et al.

(10) Patent No.: US 7,700,499 B2
(45) Date of Patent: Apr. 20, 2010

(54) MULTILAYER SILICON NITRIDE DEPOSITION FOR A SEMICONDUCTOR DEVICE

(75) Inventors: Kurt H. Junker, Austin, TX (US); Paul A. Grudowski, Austin, TX (US); Xiang-Zheng Bo, Austin, TX (US); Tien Ying Luo, Beacon, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/008,607

(22) Filed: Jan. 11, 2008

(65) Prior Publication Data

US 2008/0173986 A1 Jul. 24, 2008

(51) Int. Cl.
*H01L 21/31* (2006.01)
(52) U.S. Cl. ............... 438/791; 438/795; 257/E21.633
(58) Field of Classification Search ............... 438/199, 438/724, 795, 791, 902; 257/E21.633
See application file for complete search history.

(56) References Cited

U.S. PATENT DOCUMENTS

| 2006/0105106 A1 | 5/2006 | Balseanu et al. | |
|---|---|---|---|
| 2006/0118892 A1 | 6/2006 | Wu et al. | |
| 2008/0026523 A1* | 1/2008 | Lee et al. | 438/231 |
| 2008/0138983 A1* | 6/2008 | Lien et al. | 438/680 |

FOREIGN PATENT DOCUMENTS

| JP | 11145464 | 5/1999 |
|---|---|---|
| JP | 2003273240 A | 9/2003 |
| JP | 2006237070 A | 9/2006 |
| KR | 1020060128120 A | 12/2006 |

OTHER PUBLICATIONS

V. Sharmadlikari et al.; "UV-assisted processing for advanced dielectric films"; Solid State Technology, Mar. 2005, pp. 43, 44, and 46; www.solid-state.com.
PCT International Search Report and Written Opinion PCT/US2008/051249 related to Applicant's file reference MT10333TP-2, dated May 20, 2008.
Junker, Kurt; U.S. Appl. No. 11/655,461; File-wrapper; 99 pages.
Freescale Semiconductor Inc.; PCT/US2008/051249; Search Report and Written Opinion dated May 20, 2008; 11 pages.

* cited by examiner

*Primary Examiner*—Quoc D Hoang
(74) *Attorney, Agent, or Firm*—John A. Fortkort; Fortkort & Houston P.C.

(57) ABSTRACT

A method for making a semiconductor device is provided which comprises (a) providing a semiconductor structure equipped with a gate (209) and a channel region, said channel region being associated with the gate; (b) depositing a first sub-layer (231) of a first stressor material over the semiconductor structure, said first stressor material containing silicon-nitrogen bonds and imparting tensile stress to the semiconductor structure; (c) curing the first stressor material through exposure to a radiation source; (d) depositing a second sub-layer (233) of a second stressor material over the first sub-layer, said second stressor material containing silicon-nitrogen bonds and imparting tensile stress to the semiconductor structure; and (e) curing the second sub-layer of stressor material through exposure to a radiation source.

22 Claims, 6 Drawing Sheets

MULTILAYER SILICON NITRIDE DEPOSITION FOR A SEMICONDUCTOR DEVICE

FIELD OF THE DISCLOSURE

The present disclosure relates generally to semiconductor devices, and more particularly, to methods for making semiconductor devices having etch stop layer (ESL) stressor structures therein.

BACKGROUND OF THE DISCLOSURE

The use of a thin layer of strained silicon in the channel layer of CMOS devices has been found to improve the performance characteristics of these devices. The presence of strain in the channel layer causes the individual silicon atoms within that layer to be forced farther apart, or closer together, in their lattice structure than would be the case in the unstrained material. The larger or smaller lattice spacing results in a change in the electronic band structure of the device such that current carriers (i.e., electrons and holes) have higher mobilities within the channel layer, thereby resulting in higher currents in the transistor and faster circuit speeds.

In CMOS devices, strained channel layers may be achieved by imparting local mechanical stresses to the device. Electron mobility, and therefore NMOS performance, may be improved by imparting tensile stress along (i.e., parallel to) the direction of current flow or orthogonal to the direction of current flow. Hole mobility, and therefore PMOS performance, may be enhanced by imparting compressive stress parallel to the direction of current flow, and by imparting tensile stress perpendicular to the direction of current flow.

Contact etch stop layer (ESL) films may be utilized to impart local mechanical stresses, and in particular, tensile or compressive stresses, to the channel layer of an NMOS or PMOS device. Thus, tensile stress may be imparted to an NMOS channel by applying a tensile etch stop film, and compressive stress may be imparted to a PMOS channel by applying a compressive etch stop film.

BRIEF DESCRIPTION OF THE DRAWINGS

FIG. 17 is an illustration of an exposure chamber suitable for exposing a silicon nitride material to a suitable energy beam source; and FIG. 18 is a graph showing tensile stress in an ESL stressor film during each stage in a 5-stage process for making the film in accordance with the teachings herein.

DETAILED DESCRIPTION

Figure 1:
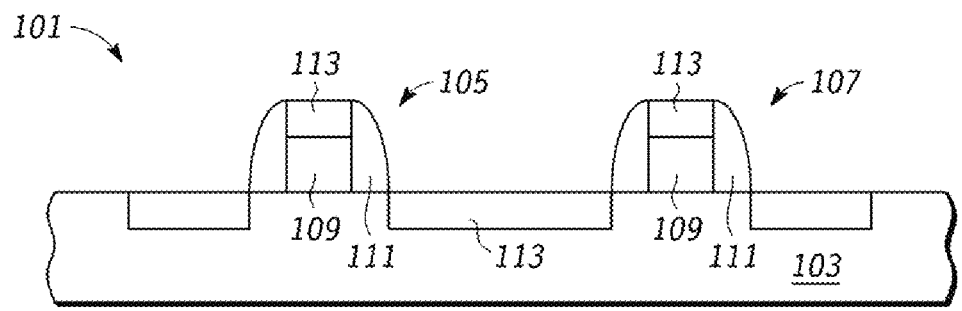
FIG. 1 illustrates a step in a prior art process for making a dual stressor structure.

In one aspect, a method for making a semiconductor device is provided which comprises (a) providing a semiconductor structure equipped with a gate and having a channel region associated with the gate; (b) depositing a first sub-layer of a first stressor material over the channel region, said first stressor material containing silicon-nitrogen bonds and imparting tensile stress to the semiconductor structure; (c) curing the first stressor material through exposure to a radiation source; (d) depositing a second sub-layer of a second stressor material over the first sub-layer, said second stressor material containing silicon-nitride bonds and imparting tensile stress to the semiconductor structure; and (e) curing the second sub-layer of stressor material through exposure to a radiation source. The first and second stressor materials may be the same or different.

In another aspect, a method for making a semiconductor device is provided which comprises (a) providing a semiconductor structure equipped with a gate and having a channel region associated with the gate; (b) depositing a first sub-layer of a stressor material over the semiconductor structure, said stressor material containing silicon-nitrogen bonds; (c) curing the first stressor material through exposure to a UV radiation source; (d) depositing a second sub-layer of the stressor material over the first sub-layer; and (e) curing the second sub-layer of stressor material through exposure to a UV radiation source.

In a further aspect, a semiconductor device is provided which comprises (a) a semiconductor structure equipped with a gate and having a channel region associated with the gate; and (b) a stressor layer disposed over the semiconductor structure, said stressor layer comprising at least first and second sub-layers of a stressor material which contains silicon-nitrogen bonds. The stressor layer preferably imparts tensile stress to the semiconductor structure.

While the use of contact etch stop layer (ESL) stressor films in CMOS devices has some notable advantages, current semiconductor processes which utilize these films also face certain challenges. In particular, silicon nitride (SiN) ESL stressor films have come into wide use in CMOS fabrication, due to the desirable properties these films possess. However, the conventional PECVD (plasma enhanced chemical vapor deposition) film deposition techniques which have been developed for semiconductor device fabrication are typically found to limit the tensile stress achievable in SiN films to about 1.2 GPa. Higher tensile stress levels are currently desired in these films in order to achieve further enhancement in the drive currents in NMOS devices, especially in dual ESL stressor integrations.

One known method of producing high tensile stress (greater than 1.5 GPa) ESL films involves the UV cure of low stress, high hydrogen-content SiN films. However, this technique is found to frequently result in cracking along the deposition seams in the resulting film. Without wishing to be bound by theory, this problem is believed to arise from film shrinkage. Such cracking results in stress relaxation in the SiN film, and hence reduces the performance improvement that might otherwise be achieved by this process.

It has now been found that the aforementioned infirmities may be overcome by depositing ESL stressor films in multiple steps and/or as multiple thinner films or sub-layers until the target overall film thickness is achieved, rather than forming the film in a single step as a monolithic construct. Preferably, each thin film deposition is also accompanied by exposure to a radiation source, and preferably through exposure to a UV source, wherein the UV cure is shorter than the single UV cure typically used in monolithic stressor film depositions. ESL stressor films, especially those containing silicon-nitrogen bonds and, in particular, silicon nitride tensile stressor films, may be formed in this manner which have high tensile stress, and which exhibit an improved resistance to cracking.

By way of example, one existing dual ESL stressor integration utilizes a thick (800-950 Å) silicon nitride film deposition and a long (15-25 minute) UV cure. In accordance with the methodology disclosed herein, this film deposition may be separated into multiple, thinner film depositions (200-250 Å each) which, in the aggregate, meet the target film thickness, and each of these thinner films may be subjected to shorter cure times (5-10 minutes each). A final long (15-25 minute) UV cure may be utilized to maximize the tensile stress in the resulting film.

The methodologies disclosed herein may be further appreciated in the context of the prior art process depicted in FIGS. 1-9. The process depicted therein is a known process for making a MOSFET device with a dual ESL stressor integration. In this process, tensile films and compressive films are selectively applied to the NMOS and PMOS regions, respectively, of a CMOS transistor. It is to be noted that the structures depicted in these figures (as well as in subsequent FIGS. 10-13) have been simplified for ease and clarity of illustration. Thus, for example, although not shown in the figures, it will be appreciated that the NMOS and PMOS regions in a semiconductor device will typically be isolated from each other by way of one or more trench isolation structures.

As shown in FIG. 1, a structure 101 is provided which comprises a substrate 103 upon which are defined first 105 and second 107 gate structures corresponding, respectively, to the NMOS and PMOS regions of a CMOS device. Each of the gate structures 105, 107 comprises a gate electrode 109 and adjacent spacer structures 111. A layer of silicide 113 is present on the gate electrodes 109 and the portions of the substrate 103 adjacent thereto.

Figure 2:
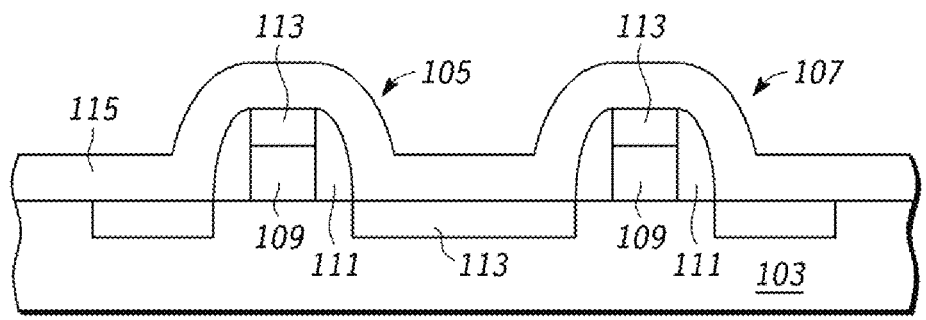
FIG. 2 illustrates a step in a prior art process for making a dual stressor structure.
Figure 3:
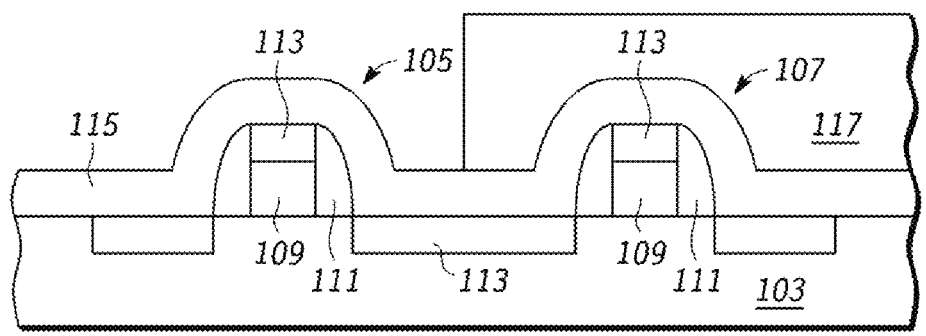
FIG. 3 illustrates a step in a prior art process for making a dual stressor structure.
Figure 4:
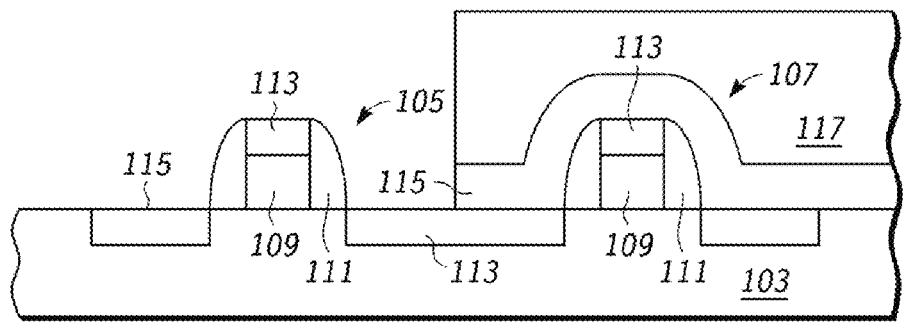
FIG. 4 illustrates a step in a prior art process for making a dual stressor structure.
Figure 5:
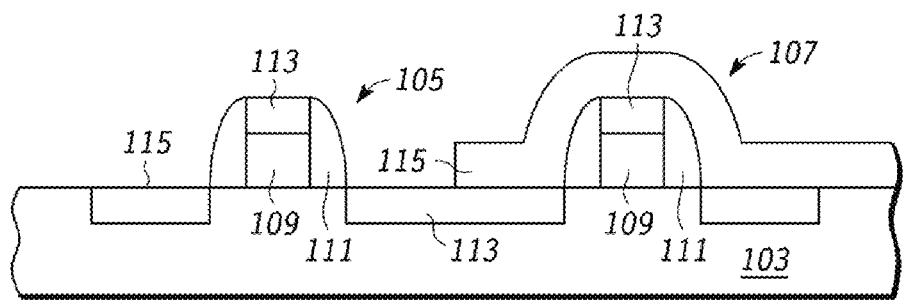
FIG. 5 illustrates a step in a prior art process for making a dual stressor structure.
Figure 6:
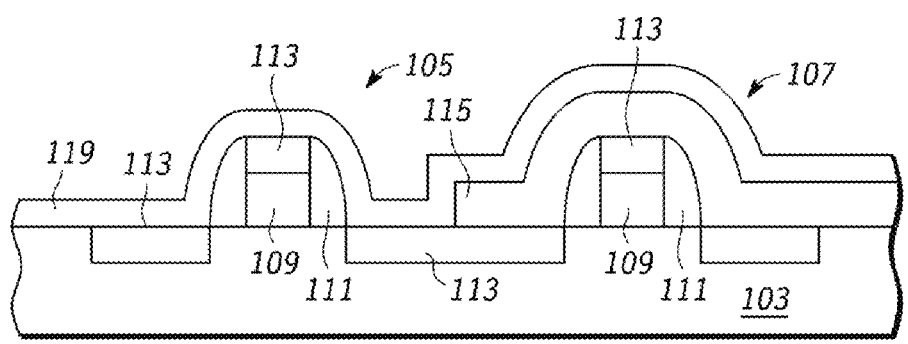
FIG. 6 illustrates a step in a prior art process for making a dual stressor structure.

Referring now to FIG. 2, a compressive stressor layer 115 is deposited over the structure. The compressive stressor layer 115 is deposited as a conformal layer. As shown in FIG. 3, a first layer of photoresist 117 is then deposited over the structure and is patterned such that the region of the structure containing the first gate structure 105 is exposed, and the region of the structure containing the second gate structure 107 is masked. The exposed portion of the compressive stressor layer 115 is then removed from the device with a dry etch, as shown in FIG. 4. The first layer of photoresist 117 is then stripped as shown in FIG. 5, after which a conformal tensile stressor layer 119 is deposited over the structure, as shown in FIG. 6.

Figure 7:
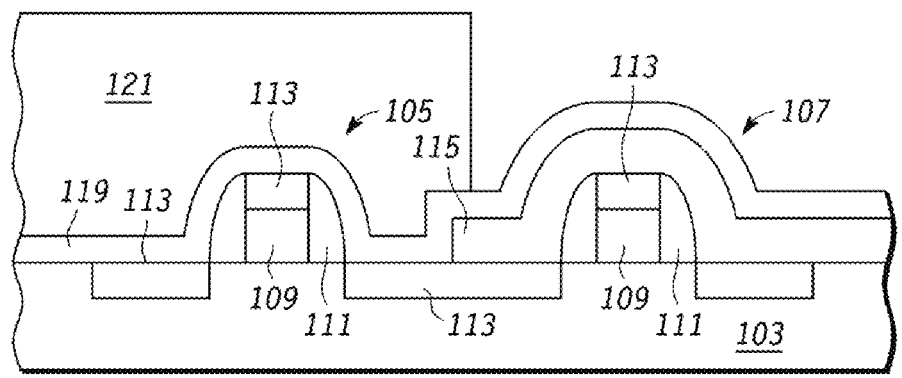
FIG. 7 illustrates a step in a prior art process for making a dual stressor structure.
Figure 8:
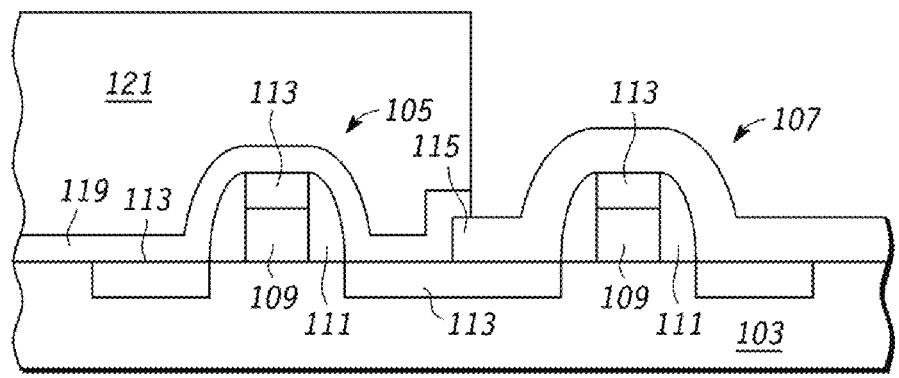
FIG. 8 illustrates a step in a prior art process for making a dual stressor structure.
Figure 9:
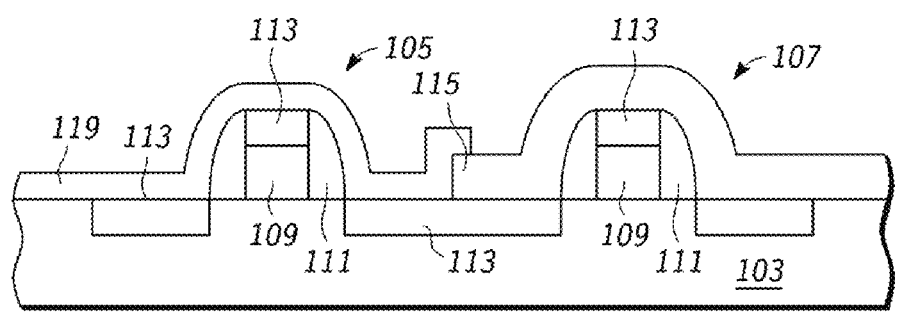
FIG. 9 illustrates a step in a prior art process for making a dual stressor structure.

Referring now to FIG. 7, a second layer of photoresist 121 is deposited over the structure and is patterned such that the region of the structure containing the second gate structure 107 is exposed, and the region of the structure containing the first gate structure 105 is masked. As shown in FIG. 8, the tensile stressor layer 119 is then removed from the exposed region with a suitable etchant. The second layer of photoresist 121 is then stripped to yield the structure shown in FIG. 9. The structure depicted therein has a tensile stressor layer 119 disposed over the NMOS region 107 of the device, and a compressive stressor layer 115 disposed over the PMOS region 105 of the device.

FIGS. 10-15 illustrate a first particular, non-limiting embodiment of a process for making an ESL stressor film in accordance with the teachings herein. The process is illustrated in the context of a dual ESL process of the general type depicted in FIGS. 1-9, though it will be appreciated that this process may be incorporated into various other fabrication processes that utilize stressor films, including single ESL processes. Hence, the methodology disclosed herein is not limited in its application to processes of the type depicted in FIGS. 1-9.

The particular embodiment depicted in FIGS. 10-15 follows the same general methodology as the process depicted in FIGS. 1-9, with two significant differences. First of all, as explained in greater detail below, in the process of FIGS. 10-15, the tensile stressor layer is deposited in a multi-step process with intervening curing, as through exposure to a UV source, an e-beam source, or another suitable radiation source.

Secondly, since exposure of a compressive stressor layer to a radiation source can adversely affect the physical properties of that layer (e.g., by inducing relaxation in the compressive stressor layer), it is preferable to form the tensile stressor layer first, followed by deposition of the compressive stressor layer once curing of the tensile stressor layer has been completed. Of course, it will be appreciated that, in some embodiments, the compressive stressor layer may nonetheless be formed first, as in embodiments where that layer may be appropriately shielded from the radiation source used to cure the tensile stressor layer, or in situations in which exposure of the compressive stressor layer to the radiation source used to cure the tensile stressor layer can be tolerated.

Figure 10:
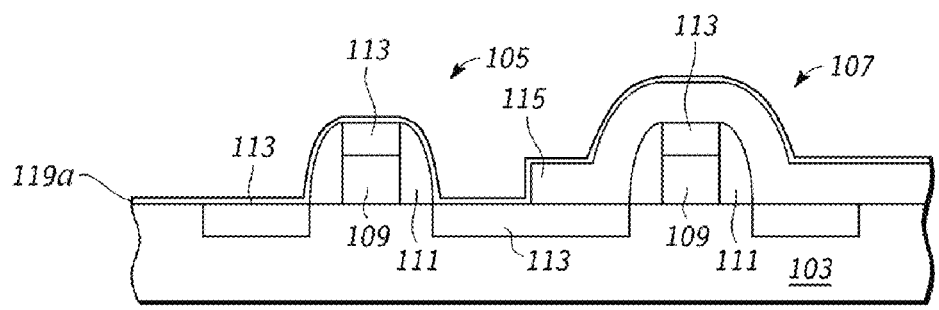
FIG. 10 illustrates a step in a process for making a dual stressor structure in accordance with the teachings herein.

Referring now to FIG. 10, a structure 201 is provided which comprises a substrate 203 upon which are defined first 205 and second 207 gate structures corresponding, respectively, to the NMOS and PMOS regions of a CMOS device. Each of the gate structures 205, 207 comprises a gate electrode 209 and adjacent spacer structures 211. A layer of silicide 213 is present on the gate electrodes 209 and the portions of the substrate 203 adjacent thereto.

Figure 11:
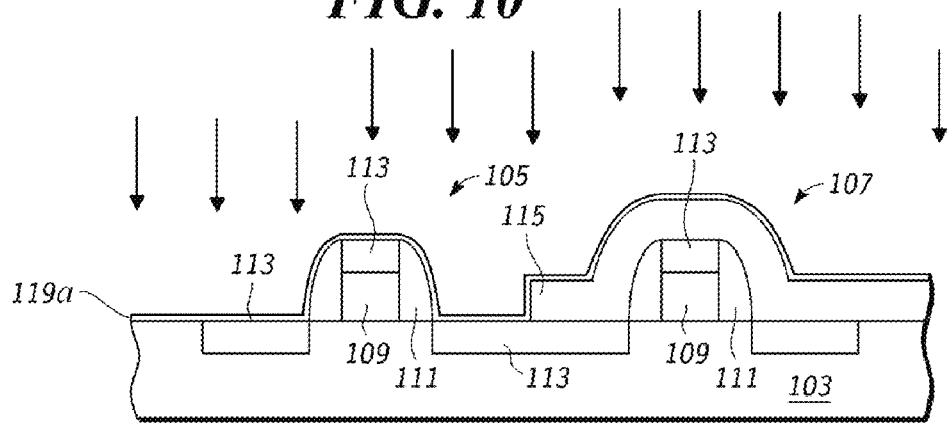
FIG. 11 illustrates a step in a process for making a dual stressor structure in accordance with the teachings herein.
Figure 12:
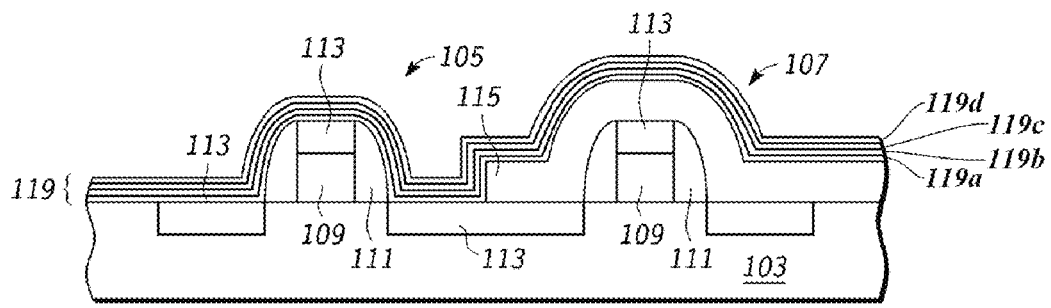
FIG. 12 illustrates a step in a process for making a dual stressor structure in accordance with the teachings herein.
Figure 13:
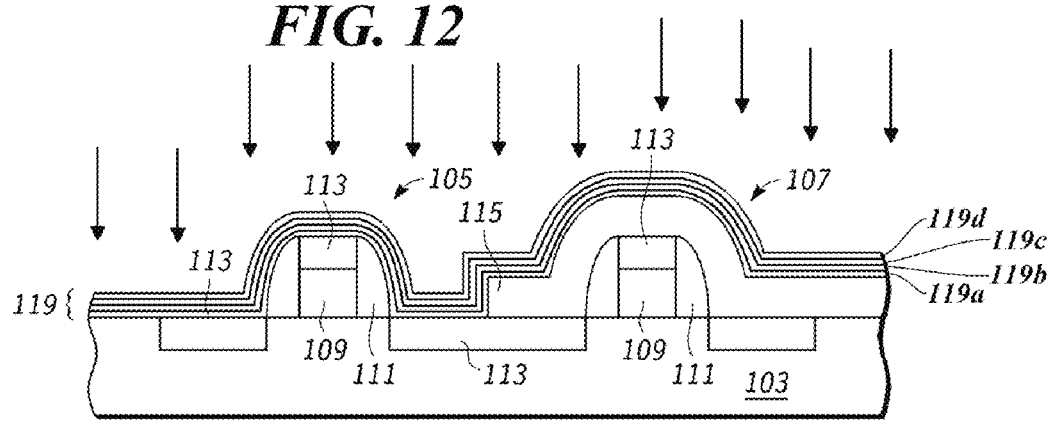
FIG. 13 illustrates a step in a process for making a dual stressor structure in accordance with the teachings herein.
Figure 14:
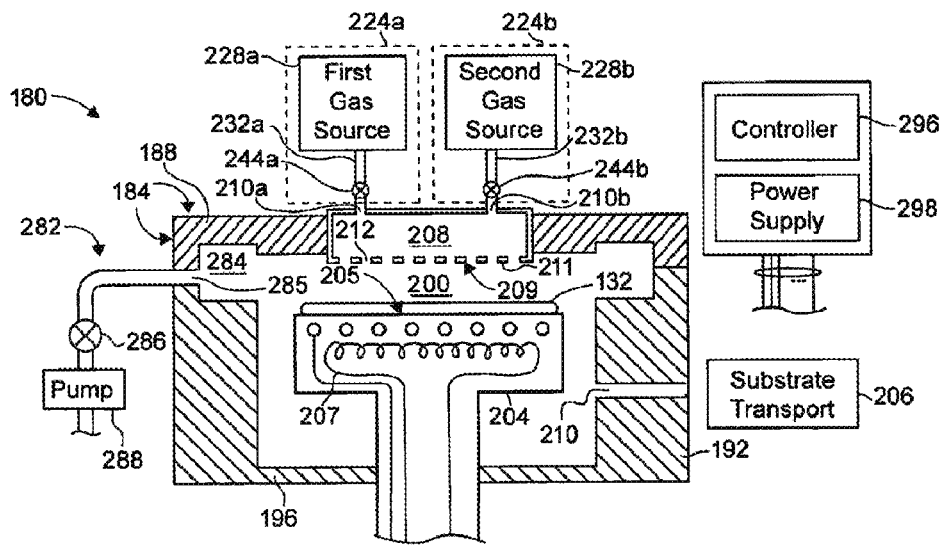
FIG. 14 illustrates a step in a process for making a dual stressor structure in accordance with the teachings herein.
Figure 15:
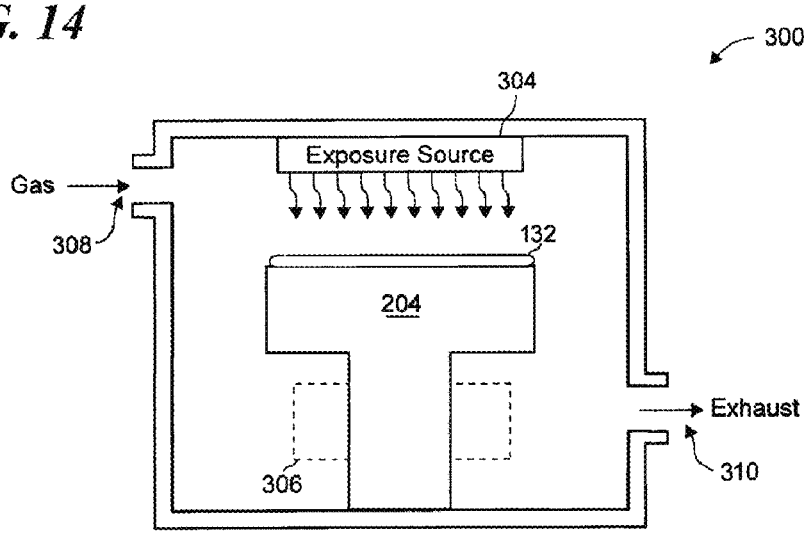
FIG. 15 illustrates a step in a process for making a dual stressor structure in accordance with the teachings herein.

As seen in FIG. 11, a first tensile stressor sub-layer 219a is deposited over the structure as a conformal layer. The first tensile stressor sub-layer 219a is then exposed to a UV source as shown in FIG. 12. The steps depicted in FIGS. 11-12 are then repeated until the target thickness of the tensile stressor layer 219 is obtained, as shown in FIG. 13. In the particular embodiment depicted, these steps are repeated three times, and the resulting tensile stressor layer 219 comprises first, 231, second 233, third 235 and fourth 237 tensile stressor sub-layers, each of which is separately deposited and exposed to a suitable UV source. The resulting tensile stressor layer 219 is then exposed to a final UV cure as shown in FIG. 14. Suitable masking and etching steps, analogous to those depicted in the process steps depicted in FIGS. 3-9, may then be utilized to derive the structure depicted in FIG. 15 which has a tensile stressor layer 219 disposed over the NMOS region 205 of the device, and a compressive stressor layer 215 disposed over the PMOS region 207 of the device.

The parameters in the foregoing process may vary. Preferably, when a UV source is used as the radiation source, the duration of UV exposure for each stressor sub-layer is less than about 15 minutes, is more preferably within the range of about 5 to about 15 minutes, and is most preferably within the range of about 5 to about 10 minutes. The final stressor layer is preferably subjected to a final UV exposure having a duration of at least 10 minutes, more preferably within the range of about 10 to about 60 minutes, and most preferably within the range of about 15 to about 25 minutes. The intervening and final UV exposures are typically conducted at a temperature within the range of about 300° C. to about 500° C., are preferably conducted at a temperature within the range of about 325° C. to about 475° C., are more preferably conducted at a temperature within the range of about 350° C. to about 450° C., and are most preferably conducted at a temperature within the range of about 375° C. to about 425° C.

The final stressor layer preferably comprises at least two sub-layers, more preferably at least three sub-layers, and most preferably at least four sub-layers. The final stressor layer also preferably has a tensile stress of at least 1.2 GPa, more preferably at least 1.3 GPa, even more preferably at least 1.4 GPa, and most preferably at least 1.5 GPa.

The final stressor (that is, the layer formed by the combination of all of the sub-layers) typically has a thickness within the range of about 200 Å to about 1500 Å, preferably has a thickness within the range of about 500 Å to about 1200 Å, more preferably has a thickness within the range of about 700 Å to about 1050 Å, and most preferably has a thickness within the range of about 800 Å to about 950 Å. The stressor sub-layers typically have a thickness within the range of about 50 Å to about 500 Å, preferably has a thickness within the range of about 100 Å to about 400 Å, more preferably has a thickness within the range of about 150 Å to about 300 Å, and most preferably has a thickness within the range of about 200 Å to about 250 Å.

Figure 16:
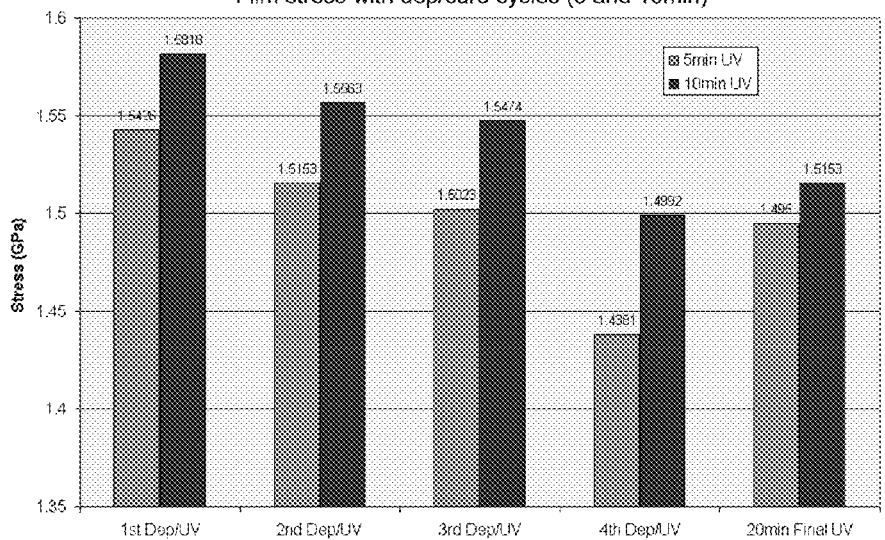
FIG. 16 is an illustration of a PECVD deposition chamber that may be used to deposit SiN films in accordance with the methodology herein.

Various substrate process chambers may be used to implement the methodology described herein and, in particular, the deposition steps thereof (here it is to be noted that the radiation exposure steps may be conducted in the same process chamber or in a different chamber or tool). One particular, non-limiting embodiment of such a substrate process chamber 380 that can be used for this purpose is depicted in FIG. 16. The particular chamber 380 depicted therein is a plasma enhanced chemical vapor deposition (PECVD) chamber which is suitable for processing a semiconductor substrate 332, such as a silicon wafer. The chamber 380 comprises enclosure walls 384, which include a ceiling 388, sidewalls 392, and a bottom wall 396 which enclose a process zone 400.

During a typical process cycle, the substrate support 404 is lowered, and a substrate 332 is then passed through an inlet port 410 and is placed on the support 404 by a robotic arm or other suitable substrate transport 206. The substrate support 206 is adapted to be moved between a lower position for loading and unloading, and an upper position for processing of the substrate 332.

The substrate support 404 may include an enclosed electrode 405 to generate a plasma from a process gas stream which is introduced into the chamber 380. The substrate support 404 is also typically equipped with a heater 407 which, in the particular embodiment depicted, comprises an electrically resistive heating element. The substrate support 404 typically includes a ceramic structure which has a receiving surface to receive the substrate 332, and which protects the electrode 405 and heater 407 from the chamber environment. In use, a radio frequency (RF) voltage is applied to the electrode 405, and a direct current (DC) voltage is applied to the heater 407.

After a substrate 332 is loaded onto the support 404, the support 404 is raised to a suitable processing position with respect to the gas distributor 408 such that a desired spacing gap distance $d_s$ is attained. The spacing gap distance is typically from about 2 mm to about 12 mm. The gas distributor 408 is disposed above the process zone 400, and is adapted to disperse a process gas stream uniformly across the substrate 332. The gas distributor 408 may also be adapted to separately deliver two independent streams of first and second process gases to the process zone 400 without mixing the gas streams prior to their introduction into the process zone 400, and may also be adapted to premix the process gases prior to their introduction into the process zone 400.

The gas distributor 408 comprises a faceplate 411 having holes 412 therein that allow the passage of the process gas stream therethrough. The substrate process chamber 380 also comprises first and second gas supplies 424a, 424b to deliver the first and second process gas to the gas distributor 408, the gas supplies 424a, 424b each comprising a gas source 428a, 428b, one or more gas conduits 432a, 432b, and one or more gas valves 444a, 444b.

The process gas stream may be energized to form a plasma by coupling electromagnetic energy, such as high frequency voltage energy, to the process gas. To energize the first process gas, a voltage is applied between (i) the electrode 405 in the support 404, and (ii) a second electrode 409 which may be the gas distributor 408, ceiling 388 or chamber sidewall 392. The voltage applied across the pair of electrodes 405, 409 capacitatively couples energy to the process gas in the process zone 400.

Typically, the voltage applied to the electrode 405, 409 is at a radio frequency within the range of from about 3 kHz to about 300 GHz. The selected radio frequency voltage is applied to the first electrode 405 at a power level of from about 10 W to about 1000 W, and the second electrode 409 is typically grounded. However, the particular radio frequency range that is used, and the power level of the applied voltage, may depend upon the particulars of the stressed material to be deposited.

The chamber 380 is also equipped with a gas exhaust 482 to remove spent process gas and byproducts from the chamber 380 and maintain a predetermined pressure of process gas in the process zone 400. In the particular device depicted, the gas exhaust 482 includes a pumping channel 484 that receives spent process gas from the process zone 400, an exhaust port 485, a throttle valve 486, and one or more exhaust pumps 488 to control the pressure of process gas in the chamber 380.

A controller 496 is also provided to control the activities and operating parameters of the chamber 380. The controller 496 may comprise, for example, a processor and memory. The processor is typically adapted to execute chamber control software, such as a computer program stored in the memory. The chamber control software typically includes sets of instructions that dictate the timing, mixture of gases, chamber pressure, chamber temperature, microwave power levels, high frequency power levels, support position, and other parameters of a particular process.

The chamber 380 also comprises a power supply 498 to deliver power to various chamber components such as, for example, the first electrode 405 in the substrate support 404 and the second electrode 409 in the chamber. To deliver power to the chamber electrodes 405, 409, the power supply 498 comprises a radio frequency voltage source that provides a voltage having the selected radio frequencies and the desired selectable power levels.

The power supply 498 may include a single radio frequency voltage source, or multiple voltage sources that provide both high and low radio frequencies. The power supply 498 and also include an RF matching circuit. The power supply 498 may further comprise an electrostatic charging source to provide an electrostatic charge to an electrode often electrostatic chuck in the substrate support 404.

The substrate process chamber 380 may also comprise a temperature sensor (not shown), such as a thermocouple or an interferometer, to detect the temperature of surfaces, such as component surfaces or substrate surfaces, within the chamber 380. The temperature sensor will typically be adapted to relay the data it collects to the chamber controller 496. The chamber controller 496 may then use this temperature data to control the temperature of the process chamber 380, for example, by controlling the resistive heating element in the substrate support 404.

As noted above, the exemplary chamber 380 may be used to deposit silicon nitride ESL stressor films. Silicon nitride films of varying chemistry and stoichiometry may be used in these processes. Such materials will contain varying amounts of silicon-nitrogen (Si—N) bonds, and may include materials such as silicon nitride, silicon oxy-nitride, silicon-oxygen-hydrogen-nitrogen, and other stoichiometric or non-stoichiometric combinations of silicon, nitrogen, oxygen, hydrogen, and/or carbon.

It has been found that a silicon nitride stressed material having higher stress values can be obtained by increasing the net hydrogen content, or the amount of silicon-hydrogen bonds (Si—H bonds), in the deposited silicon nitride material. Several different deposition process parameters, treatments of deposited material, or combinations thereof, may be used to achieve lower hydrogen content in the deposited material.

To deposit a tensile stressed silicon nitride material, the process gas introduced into the chamber comprises a first component that includes a silicon-containing gas and a second component that includes a nitrogen-containing gas. The silicon-containing gas can be, for example, silane, disilane, trimethylsilyl (TMS), tris(dimethylamino)silane (TDMAS), bis(tertiary-butylamino)silane (BTBAS), dichlorosilane (DCS), and combinations thereof. By way of example, a suitable silane flow rate may be from about 5 to about 100 sccm.

The nitrogen-containing gas may be, for example, ammonia, nitrogen, and combinations thereof. By way of example, a suitable ammonia flow rate may be from about 10 to about 200 sccm. The process gas may also include a diluent gas that is provided in a much larger volume that the reactive gas components. The diluent gas may also serve both as a diluent and, at least partially, as a reactant nitrogen-containing gas. Thus, for example, nitrogen gas may be utilized as a diluent gas at a flow rate of from about 5000 to about 30,000 sccm.

When depositing silicon oxy-nitride materials, the process gas may also contain additional gases, such as oxygen or oxygen-containing gases. Typical gas pressures in these processes are from about 3 to about 10 Torr; substrate temperatures are from about 300 to 600° C.; electrode spacing is from about 5 mm (200 mils) to about 12 mm (600 mils); and RF power levels are from about 5 to about 500 Watts.

In some embodiments, the tensile stress of an as-deposited silicon nitride material may be further increased by exposing the deposited material to a suitable energy source, such as ultraviolet radiation or electron beams. The energy beam exposure can be performed within the CVD chamber itself, or in a separate chamber.

For example, a substrate having the deposited stressed material may be exposed to ultraviolet or electron beam radiation inside the CVD process chamber. The ultraviolet or electron beams may be applied to the substrate, in-situ in the CD deposition chamber, or during a CVD reaction to deposit the stressed material.

FIG. 17 shows an exemplary embodiment of an exposure chamber 500 which can be used to expose a substrate 332 to ultraviolet radiation or electron beam treatment in accordance with the teachings herein. In the particular embodiment depicted, the chamber 500 includes a substrate support 404 which is moveable between a released position distal from the exposure source 504, and a lifted position proximate to the exposure source 504. The substrate support 404 supports the substrate 332 in the chamber 500. During insertion and removal of the substrate 332 from the exposure chamber 500, the substrate support 404 may be moved to a loading position, and thereafter, during exposure of the substrate 332, the support 404 may be raised into the lifted position to maximize exposure levels. The chamber 500 further comprises a heater 506, such as a resistive element or a radiative heat source, which may be used to heat the substrate 132 to a desired temperature during exposure of the substrate 332. A gas inlet 508 is provided to introduce a gas into the exposure chamber 500, and a gas outlet 510 is provided to exhaust the gas from the exposure chamber 500.

The exposure chamber 500 further includes an exposure source 504 that provides a suitable energy beam, such as ultraviolet radiation or electron beams. If the exposure source 504 is a UV radiation source, the UV radiation source may comprise a suitable ultraviolet radiation source that can emit a single ultraviolet wavelength, or a broadband of ultraviolet wavelengths. A suitable single wavelength ultraviolet source may comprise an excimer ultraviolet source that provides a single ultraviolet wavelength of 172 nm or 222 nm. A suitable broadband source may be utilized which is adapted to generate ultraviolet radiation having wavelengths of from about 200 to about 400 nm.

The stressed material may be exposed to ultraviolet radiation having other wavelengths that are generated by lamps containing gases that radiate at specific wavelengths when electrically stimulated. For example, suitable ultraviolet lamps may comprise Xe gas, which generates ultraviolet radiation having a wavelength of 172 nm. In other embodiments, the lamp may comprise other gases having different corresponding wavelengths. Thus, for example, mercury lamps radiate at a wavelength of 243 nm, deuterium lamps radiate at a wavelength of 140 nm, and $KrCl_2$ lamps radiate at a wavelength of 222 nm.

Generation of ultraviolet radiation specifically tailored to modify the stress value in the deposited stressed material may also be accomplished by introducing a mixture of gases into the lamp, each gas capable of emitting radiation of a characteristic wavelength upon excitation. By varying the relative concentration of the gases, the wavelength content of the output from the radiation source can be selected to simultaneously expose all of the desired wavelengths, thus minimizing the necessary exposure time. The wavelength and intensity of the ultraviolet radiation can be selected to obtain predetermined tensile stress values in the deposited (preferably silicon nitride) stressor material.

The CVD deposition chamber 380 and exposure chamber 500 may also be integrated together on a multi-chamber process platform (not shown) served by a single robotic arm. The exposure source 504 and the support of the exposure chamber 500, and the components of the CVD deposition chamber 380 that include the substrate support 404, motor, valves or flow controllers, gas delivery system, throttle valve, high frequency power supply, and heater 506, and the robotic arm of the integrated processing system, may all be controlled by a system controller over suitable control lines. The system controller relies on feedback from optical sensors to determine the position of movable mechanical assemblies such as the throttle valve and substrate support 404 which are moved by appropriate motors under the control of the controller.

For exposure treatment in the described exposure chamber 500, a substrate having a stressor material thereon is inserted into the exposure chamber 500 and placed upon the substrate support 404 in the lowered position. The substrate support 404 is then raised to a lifted position, the optional heater 506 in the support powered on, and the exposure source 504 is activated. During exposure, a gas may be circulated through the exposure chamber 500, such as helium or nitrogen, to improve thermal heat transfer rates between the substrate and the support. Other gases may also be used. After a period of radiation exposure, the exposure source 504 is deactivated and the substrate support 404 is lowered back into the released position. The substrate bearing the exposed silicon nitride stressed material is then removed from the exposure chamber 500.

FIG. 18 illustrates the stress levels observed at each stage in a 5-stage process of the type depicted in FIGS. 10-15 using a UV lamp as the radiation source. As seen therein, in the particular embodiment to which this data relates, the stress level in the silicon nitride film was observed to decrease with the deposition of each additional SiN layer. However, at each stage, tensile stress levels were higher in devices subjected to a 10 minute UV cure as opposed to a 5 minute UV cure. The tensile stress in the final film increased in both cases after a 20 minute final UV cure, but was higher for the case in which 10 minute UV curing was used during the intermittent steps. This data thus shows that, in some applications, the length of the intermittent UV cure may be an important parameter in achieving desired tensile stress levels in the final film. This data also demonstrates the significance that a final UV cure can have on film tensile stress. Of course, one skilled in the art will appreciate that various other factors, such as product throughput, may also be considered in selecting UV cure times in a commercial implementation of the processes described herein.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a semiconductor structure equipped with first and second gate structures and having channel regions associated with the gate structures;
   depositing a first sub-layer of a first stressor material over the gate structures and channel regions, said first stressor material containing silicon-nitrogen bonds;
   curing the first stressor material through exposure to a radiation source, thereby forming a first cured sub-layer;
   depositing a second sub-layer of a second stressor material over the first cured sub-layer, said second stressor material containing silicon-nitrogen bonds;
   curing the second stressor material through exposure to a radiation source, thereby forming a second cured sub-layer;
   depositing a third sub-layer of a third stressor material between the first and second gate structures and in contact with the second sub-layer;
   curing the third stressor material through exposure to a radiation source;
   depositing a fourth sub-layer of a fourth stressor material between the first and second gate structures and in contact with the third sub-layer; and
   curing the fourth stressor material through exposure to radiation source.

2. The method of claim 1, wherein the first and second stressor materials impart tensile stress to the semiconductor structure.

3. The method of claim 1, wherein the first and second stressor materials are different.

4. The method of claim 1, wherein the radiation source is a UV radiation source.

5. The method of claim 1, wherein the radiation source is an e-beam radiation source.

6. The method of claim 1, wherein the first and second sub-layers are formed by plasma enhanced chemical vapor deposition (PECVD).

7. The method of claim 1, wherein each of the first and second sub-layers has a thickness of less than about 250 Å.

8. The method of claim 1, wherein each of the first and second sub-layers has a thickness within the range of about 200 Å to about 250 Å.

9. The method of claim 1, wherein the radiation source is a UV radiation source, wherein the step of curing the first stressor material involves exposure to the UV radiation source for less than about 10 minutes, and wherein the step of curing the second stressor material involves exposure to the UV radiation source for less than about 10 minutes.

10. The method of claim 1, wherein the radiation source is a UV radiation source, and wherein each of the first and second sub-layers is cured through exposure to UV radiation for a duration of time within the range of about 5 to about 10 minutes.

11. The method of claim 1, wherein the radiation source is a UV radiation source, wherein the semiconductor structure comprises first and second gate structures, and wherein the third sub-layer of a third stressor material is deposited between the first and second gate structures and in contact with the second sub-layer and is cured through exposure to UV radiation.

12. The method of claim 11, wherein each of the first, second and third sub-layers has a thickness of less than about 250 Å.

13. The method of claim 11, wherein each of the first, second and third sub-layers has a thickness within the range of about 200 Å to about 250 Å.

14. The method of claim 11, wherein each of the curing steps used to cure the first, second and third sub-layers involves exposure to UV radiation for less than about 10 minutes.

15. The method of claim 11, wherein each of the curing steps used to cure the first, second and third sub-layers involves exposure of the sub-layer to UV radiation for a duration of time within the range of about 5 to about 10 minutes.

16. The method of claim 1, further comprising:
   exposing each of the first cured sub-layer and the second cured sub-layer to a further curing step.

17. The method of claim 1, wherein the semiconductor device is a CMOS device, wherein the first and second sub-layers are disposed over the NMOS region of the CMOS device, and wherein the first and second sub-layers are not disposed over the PMOS region of the CMOS device.

18. The method of claim 1, wherein the semiconductor device comprises a silicide layer, and wherein the first and second sub-layers are disposed over the silicide layer.

19. The method of claim 1, wherein the first and second sub-layers of stressor material form a stressor film, and wherein the stressor film has a tensile stress of at least about 1.2 GPa.

20. The method of claim 1, wherein the first and second sub-layers of stressor material form a stressor film, and wherein the stressor film has a tensile stress of at least about 1.4 GPa.

21. The method of claim 1, wherein the first and second sub-layers of stressor material form a stressor film, and wherein the stressor film has a tensile stress of at least about 1.5 GPa.

22. A method for making a semiconductor device, comprising:

providing a semiconductor structure equipped with first and second gate structures and channel regions, said channel regions being associated with the gate structures;

depositing a first sub-layer of a stressor material over the semiconductor structure, said stressor material containing silicon-nitrogen bonds and imparting tensile stress to the semiconductor structure;

curing the first stressor material through exposure to a UV radiation source;

depositing a second sub-layer of the stressor material over the first sub-layer;

curing the second sub-layer of stressor material through exposure to a UV radiation source;

depositing a third sub-layer of a third stressor material between the first and second gate structures and in contact with the second sub-layer;

curing the third stressor material through exposure to a radiation source;

depositing a fourth sub-layer of a fourth stressor material between the first and second gate structures and in contact with the third sub-layer; and curing the fourth stressor material through exposure to radiation source.

* * * * *